(12) United States Patent
Lian et al.

(10) Patent No.: US 12,742,814 B2
(45) Date of Patent: Sep. 22, 2026

(54) PROBE MOUNTING STRUCTURE AND RELIABILITY TEST SYSTEM FOR WAFER-LEVEL RELIABILITY TEST

(71) Applicant: SEMIGHT INSTRUMENTS CO., LTD, Suzhou (CN)

(72) Inventors: Zhe Lian, Suzhou (CN); Pengsong Xu, Suzhou (CN); Shan Zhao, Suzhou (CN); Xiaoming Guo, Suzhou (CN); Jianjun Huang, Suzhou (CN)

(73) Assignee: SEMIGHT INSTRUMENTS CO., LTD, Suzhou (CN)

( * ) Notice: Subject to any disclaimer, the term of this patent is extended or adjusted under 35 U.S.C. 154(b) by 292 days.

(21) Appl. No.: 18/427,076

(22) Filed: Jan. 30, 2024

(65) Prior Publication Data

US 2024/0310433 A1 Sep. 19, 2024

Related U.S. Application Data

(63) Continuation of application No. PCT/CN2023/134131, filed on Nov. 24, 2023.

(30) Foreign Application Priority Data

Feb. 3, 2023 (CN) ........................ 202310054472.4

(51) Int. Cl.
*G01R 31/28* (2006.01)
*G01R 1/067* (2006.01)

(52) U.S. Cl.
CPC ..... *G01R 31/2875* (2013.01); *G01R 1/06722* (2013.01); *G01R 31/2863* (2013.01)

(58) Field of Classification Search
CPC ............ G01R 31/2875; G01R 31/2863; G01R 1/06722
See application file for complete search history.

(56) References Cited

FOREIGN PATENT DOCUMENTS

| | | |
|---|---|---|
| CN | 214174472 U | 9/2021 |
| CN | 218412422 U | 1/2023 |
| CN | 115792557 A | 3/2023 |
| CN | 116430194 A | 7/2023 |
| CN | 219625632 U | 9/2023 |

OTHER PUBLICATIONS

Translation of CN 214174472 U (Year: 2021).*
Translation of CN 218412422 U (Year: 2023).*
Translation of CN 114859199 A (Year: 2022).*

* cited by examiner

*Primary Examiner* — Paresh Patel
(74) *Attorney, Agent, or Firm* — ANOVA LAW GROUP, PLLC

(57) ABSTRACT

A probe mounting structure and a wafer-level reliability test system are provided. The probe mounting structure includes a probe mounting plate. The probe mounting plate is provided with mounting holes penetrating through a thickness direction of the probe mounting plate. A volume of each mounting hole is smaller than a preset value and is used to install a corresponding probe. Two ends of each probe are respectively connected to a corresponding first pad on a circuit board and a corresponding die of a wafer under test. Two sides of the probe mounting plate are in contact with the test circuit board and the wafer under test respectively, such that each of the mounting holes forms a sealed chamber. The mounting holes are filled with high-pressure gas to ensure that the wafer under test does not spark during high-voltage testing.

17 Claims, 6 Drawing Sheets

PROBE MOUNTING STRUCTURE AND RELIABILITY TEST SYSTEM FOR WAFER-LEVEL RELIABILITY TEST

CROSS-REFERENCE TO RELATED APPLICATION

This application is a continuation of International Application No. PCT/CN2023/134131, filed on Nov. 24, 2023, which claims priority to Chinese Patent Application No. 202310054472.4, filed on Feb. 3, 2023, the content of all which is incorporated herein by reference in its entirety.

TECHNICAL FIELD

The present disclosure generally relates to the field of wafer-level reliability test technology and, more particularly, relates to a probe mounting structure and a reliability test system for a wafer-level semiconductor reliability test.

BACKGROUND

A wafer-level reliability test is a reliability test performed directly on a wafer, including a high-voltage test. When performing a high-voltage test, it is necessary to apply high voltage to each die on a wafer. Generally, during a test process, probes and a test chip need to be sealed into a cavity, and arc-extinguishing gas is filled into the cavity. The air pressure in the cavity needs to be maintained at a certain pressure to ensure that spark does not happen when high voltage is applied (In normal atmospheric pressure air, high voltage will break down the air and cause sparking. High-voltage spark can be avoided by increasing the air pressure in the environment).

The above process is generally carried out by moving the probes to contact each wafer in turn. This is because when a large number of probes and test chips are placed in a large cavity and then the high-pressure gas is filled in, it is difficult to maintain the pressure on the one hand, and high-pressure gas in the large cavity is prone to explosion when the cavity structure is not strong enough, posing safety risks, on the other hand.

SUMMARY

Various embodiments of the present disclosure provide a probe mounting structure for a wafer-level reliability test. The structure is simple, the pressure is able to be maintained easily, and the safety is high. Also, the pressure in each mounting hole is ensured, and a simple structure is used to achieve batch charging and discharging of high-pressure gas to each mounting hole.

Various embodiments of the present disclosure also provide a wafer-level reliability test system including a probe mounting structure provided by the present disclosure, to make the application field of the wafer-level reliability test system wider.

One aspect of the present disclosure provides a probe mounting structure for a wafer-level reliability test. The probe mounting structure includes a probe mounting plate. The probe mounting plate is provided with a plurality of mounting holes penetrating through a thickness direction of the probe mounting plate. A volume of each of the plurality of mounting holes is smaller than a preset value and is used to install a corresponding probe. Two ends of each probe are respectively connected to a corresponding first pad on a circuit board and a corresponding die of a wafer under test. Two sides of the probe mounting plate are in contact with the test circuit board and the wafer under test respectively, such that each of the plurality of mounting holes forms a sealed chamber. The plurality of mounting holes is filled with high-pressure gas to ensure that the wafer under test does not spark during high-voltage testing.

Optionally, the preset value is configured according to a shape or a volume of one probe.

Optionally, a shape of the plurality of mounting holes matches a shape of the probes.

Optionally, the high-pressure gas is filled into the plurality of mounting holes through gas inlets connected to the plurality of mounting holes.

Optionally, a vent hole connected to each of the plurality of mounting holes is provided on the test circuit board.

Optionally, the high-pressure gas is an arc-extinguishing gas.

Optionally, the probe mounting structure further includes a soft insulating sealing plate. Two sides of the soft insulating sealing plate are respectively attached to the wafer under test and a side of the probe mounting plate away from the test circuit board; and the insulating sealing plate is provided with the plurality of through holes, and the plurality of through holes has a one-to-one correspondence to the plurality of mounting holes, such that one end of one probe passes through a corresponding one of the plurality of through holes and is in contact with a corresponding die of the wafer under test.

Optionally, the insulating sealing plate and the probe mounting plate are connected through adhesive or fasteners.

Optionally, the insulating sealing plate is made of fluorine rubber.

Optionally, a side of the insulating sealing plate facing the probe mounting plate is bonded to the probe mounting plate through adhesive, and the insulating sealing plate and the probe mounting plate are fixed with each other by providing a plurality of mounting openings on their peripheral sides for mounting fasteners.

Another aspect of the present disclosure provides a wafer-level reliability test system including a test machine, a test circuit board, probes, and a probe mounting structure. The probe mounting structure includes a probe mounting plate. The probe mounting plate is provided with a plurality of mounting holes penetrating through a thickness direction of the probe mounting plate. A volume of each of the plurality of mounting holes is smaller than a preset value and is used to install a corresponding probe. Two ends of each probe are respectively connected to a corresponding first pad on a circuit board and a corresponding die of a wafer under test. Two sides of the probe mounting plate are in contact with the test circuit board and the wafer under test respectively, such that each of the plurality of mounting holes forms a sealed chamber. The plurality of mounting holes is filled with high-pressure gas to ensure that the wafer under test does not spark during high-voltage testing. The test machine is used to provide high-voltage power for testing. The test circuit board also includes a plurality of second pads. Each of the plurality of second pads is connected to one corresponding first pad through circuits on the test circuit board, and each of the plurality of second pads is also connected to the test machine for receiving the high-voltage power from the test machine. The wafer under test is also connected to the test machine to form a test loop and the test machine is also used to determine test results of the wafer under test based on current in the test loop.

Optionally, the wafer-level reliability test system further includes a cover plate. The cover plate is attached to a side of the test circuit board away from the probe mounting plate. The cover plate is provided with a sunken platform on a side of the cover plate close to the test circuit board; the sunken platform is connected with all the plurality of vent holes; and the cover plate is also provided with an air inlet hole and an air outlet hole connected with the sunken platform, respectively used to charge or discharge of the high-pressure gas.

Optionally, the wafer-level reliability test system further includes a heating module for providing heat and a heat sink disposed between the heating module and a side of the wafer under test away from the insulating sealing plate. The heat sink is configured to conduct the heat of the heating module to the wafer under test.

Optionally, the heat sink includes: at least one vacuum hole disposed at a side surface of the heat sink close to the target object, wherein the at least one vacuum hole is used to tightly attach the target object to the heat sink; and a groove, wherein an opening of the groove is provided on a periphery of the heat sink for accommodating the insulation block.

Optionally, the heat sink is connected to the test machine to form a test loop.

Optionally, the heat sink is made of copper or gold-plated copper.

Optionally, the probes are spring probes.

Optionally, the probe mounting structure further includes a soft insulating sealing plate. Two sides of the soft insulating sealing plate are respectively attached to the wafer under test and a side of the probe mounting plate away from the test circuit board; and the insulating sealing plate is provided with the plurality of through holes, and the plurality of through holes has a one-to-one correspondence to the plurality of mounting holes, such that one end of one probe passes through a corresponding one of the plurality of through holes and is in contact with a corresponding die of the wafer under test.

Optionally, the insulating sealing plate and the probe mounting plate are connected through adhesive or fasteners.

In the probe mounting structure for the wafer-level reliability test provided by the present disclosure, a plurality of probes may be mounted at one time, to perform batch testing on all dies of the wafer under test. Since each probe is disposed in one corresponding mounting hole independently and each mounting hole is filled with the high-pressure gas to maintain the pressure of each small chamber independently, it may be unnecessary to put the whole wafer and all of the plurality of probes into one sealed chamber. The structure may be simpler, and it may be easier to maintain the pressure. Also, the safety may be higher.

In the present disclosure, the soft insulating sealing plate may be provided on one side of the probe mounting structure. Since the insulating sealing plate is soft and has one side in contact with the wafer under test, the wafer under test may be prevented from being crushed and damaged. Further, the unevenness of the wafer under test may be absorbed, ensuring the air pressure in each mounting hole.

In the present disclosure, through the arrangement of the sunken platform, the air inlet hole and the air outlet hole on the cover plate, the introduction and discharge of high-pressure gas to each mounting hole may be realized. Through a simple structure, the high-pressure gas may be charged or discharged in batches to each mounting hole.

In the present disclosure, the heating module and the heat sink may provide heat for the wafer under test, such that the wafer is kept in a reasonable temperature range during high-voltage testing.

In the present disclosure, the spring probes may be used for testing. Since a spring probe has a certain amount of expansion and contraction along its length direction, the spring probes may be compatible with different thicknesses of the wafer under test and may also be compatible with a certain degree of warpage of the wafer under test. Therefore, the spring probes may have a wider application range.

BRIEF DESCRIPTION OF THE DRAWINGS

The following drawings are merely examples for illustrative purposes according to various disclosed embodiments and are not intended to limit the scope of the present disclosure. The same reference numbers in the drawings identify the same or similar parts or portions. Those skilled in the art should understand that these drawings are not necessarily drawn to scale.

DETAILED DESCRIPTION

Reference will now be made in detail to exemplary embodiments of the disclosure, which are illustrated in the accompanying drawings. Obviously, the described embodiments are just some of the embodiments of the present disclosure, but not all of the embodiments. Based on the embodiments in this disclosure, all other embodiments obtained by those of ordinary skill in the art without creative work shall fall within the scope of this disclosure.

Figure 1:
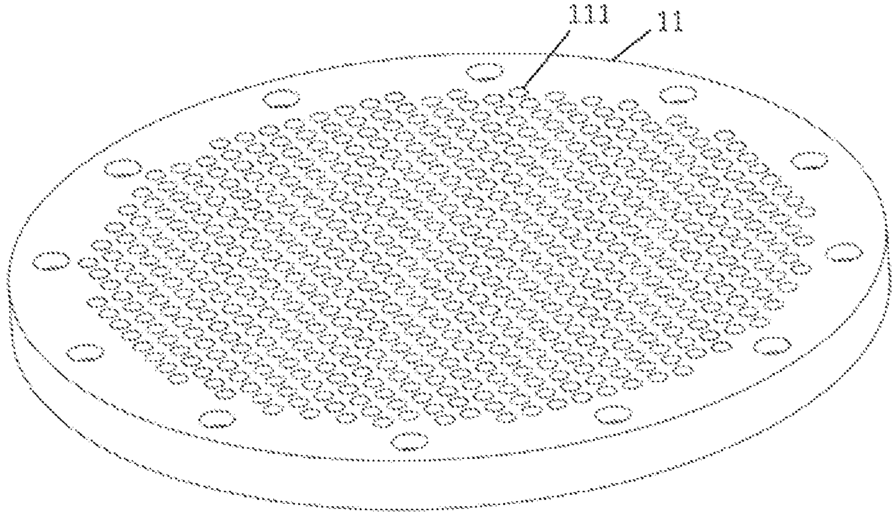
FIG. 1 illustrates an exemplary probe mounting plate of a probe mounting structure according to various disclosed embodiments of the present disclosure.
Figure 2:
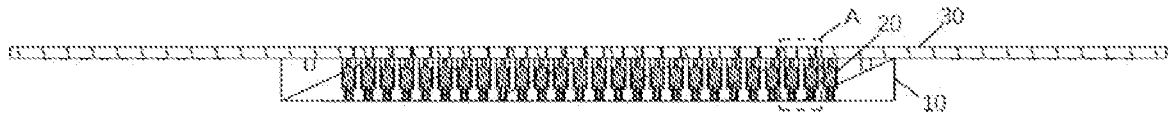
FIG. 2 illustrates a structural cross-sectional view of a probe mounting structure, a circuit board and a wafer under test, according to various disclosed embodiments of the present disclosure.
Figure 3:
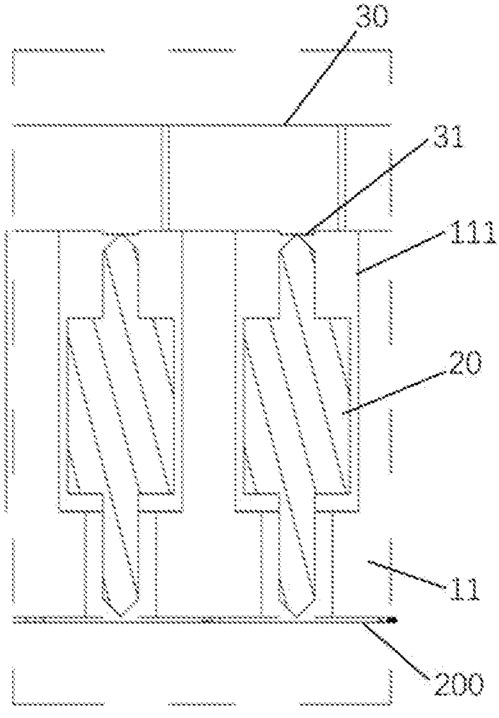
FIG. 3 illustrates a partially enlarged view of point A in FIG. 2 according to various disclosed embodiments of the present disclosure.

The present disclosure provides a probe mounting structure. In one embodiment shown in FIG. 1 illustrating a probe mounting plate of a probe mounting structure, FIG. 2 illustrating a cross-sectional view of a probe mounting structure, a circuit board, and a wafer under test, and FIG. 3 illustrating a partially enlarged view of point A in FIG. 2, the probe mounting structure 10 for a wafer-level reliability test may include a probe mounting plate 11. The probe mounting plate 11 may be provided with a plurality of mounting holes 111 extending through a thickness direction of the probe mounting plate 11. A volume of each mounting hole 111 may be smaller than a preset value. The mounting hole 111 may be used to mount one probe 20. The preset value here may be determined according to a shape and a volume of the probe 20. One mounting hole 111 may accommodate one corresponding probe 20, leaving a small gap. As shown in FIG. 3, the shape of the mounting hole 111 may match the probe 20, and a diameter of the mounting hole 111 may be slightly larger than an outer diameter of the probe 20. As shown in FIG. 3, two ends of each probe 20 may be respectively connected to a corresponding first pad 31 on a test circuit board 30 and a corresponding die of a wafer under test 200. Two sides of the probe mounting plate 11 may be in contact with the test circuit board 30 which may be a printed circuit board (PCB) and the wafer under test 200 respectively, such that each mounting hole 111 forms a closed space. The plurality of mounting holes 111 may be filled with high-pressure gas to ensure that the wafer under test 200 does not spark during high-voltage testing. High-pressure gas may be filled into the plurality of mounting holes 111 through air inlets connected to the plurality of mounting holes 111. For example, as shown in FIG. 3, a vent hole 33 correspondingly connected to each mounting hole 111 may be provided on the test circuit board 30, and the gas may be filled into the plurality of mounting holes 111 through an inflation device. The high-pressure gas may be an arc-extinguishing gas. To meet the high-voltage test at 3000 V, gas above 0.5 mPa may need to be filled.

In the probe mounting structure 10 for the wafer-level reliability test provided by the present disclosure, a plurality of probes 20 may be mounted at one time, to perform batch testing on all dies of the wafer under test 200. Since each probe 20 is disposed in one corresponding mounting hole 111 independently and each mounting hole 111 is filled with the high-pressure gas to maintain the pressure of each small chamber independently, it may be unnecessary to put the whole wafer and all of the plurality of probes 20 into one sealed chamber. The structure may be simpler, and it may be easier to maintain the pressure. Also, the safety may be higher.

Figure 4:
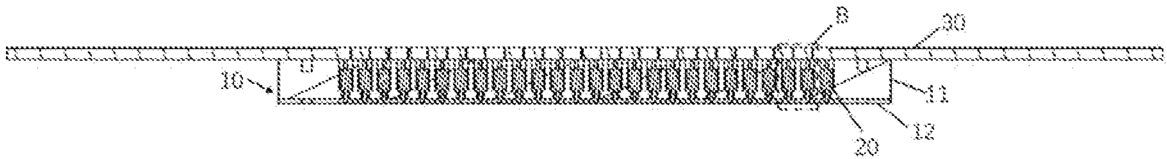
FIG. 4 illustrates another structural cross-sectional view of a probe mounting structure, a circuit board and a wafer under test, according to various disclosed embodiments of the present disclosure.
Figure 5:
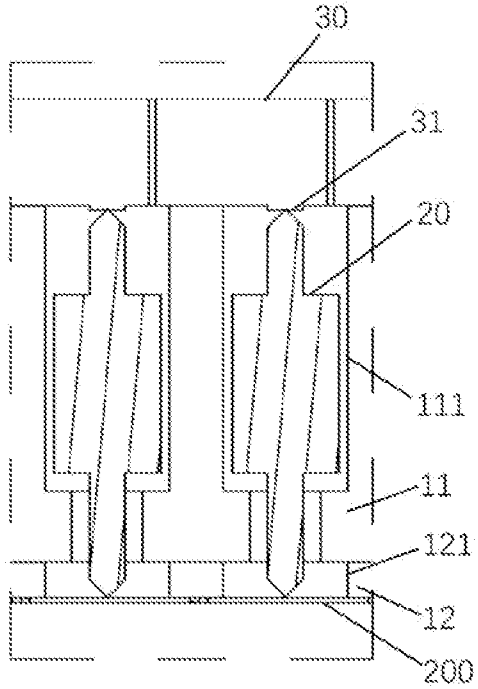
FIG. 5 illustrates a partially enlarged view of point B in FIG. 4 according to various disclosed embodiments of the present disclosure.
Figure 6:
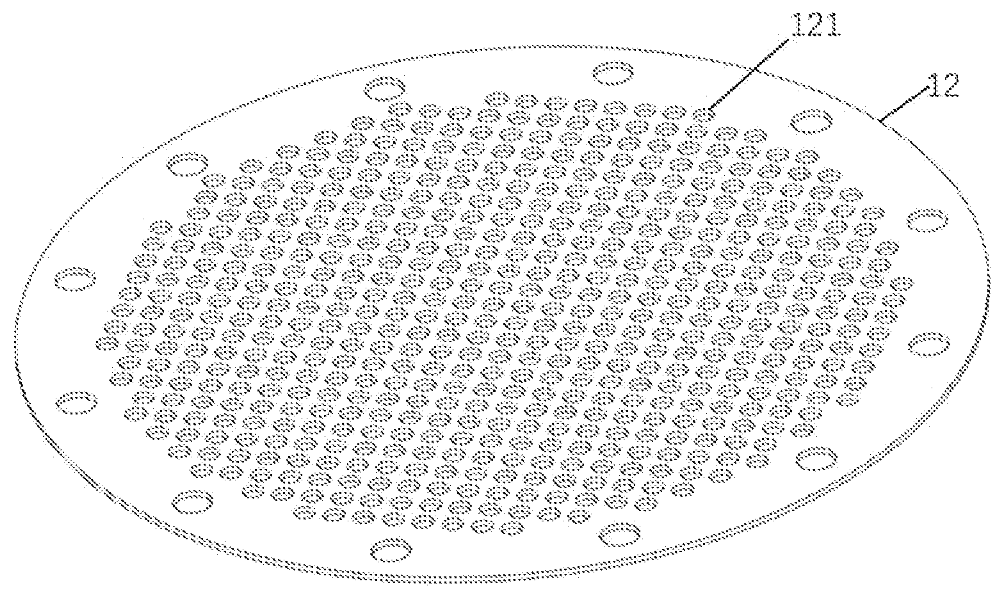
FIG. 6 illustrates an exemplary insulating sealing plate of a probe mounting structure according to various disclosed embodiments of the present disclosure.

In another embodiment shown in FIG. 4 illustrating a cross-sectional view of another probe mounting structure, a circuit board, and a wafer under test, FIG. 5 illustrating a partially enlarged view of point B in FIG. 4, and FIG. 6 illustrating an insulating sealing plate, the probe mounting structure 10 may further include a soft insulating sealing plate 12. Two sides of the insulating sealing plate 12 may be respectively attached to the wafer under test 200 and a side of the probe mounting plate 11 away from the test circuit board 30. The insulating sealing plate 12 may be made of fluorine rubber which has high temperature resistance and is able to work at high temperatures. The insulating sealing plate 12 may be provided with a plurality of through holes 121 which has a one-to-one correspondence to the plurality of mounting holes 111, such that one end of one probe 20 passes through one corresponding through hole 121 and in contact with one corresponding die of the wafer under test 200. In one embodiment, the insulating sealing plate 12 may be connected to the probe mounting plate 11 through adhesive and a fastener. For example, a side of the insulating sealing plate 12 facing the probe mounting plate 11 may be bonded to the probe mounting plate 11 through adhesive. As shown in FIG. 1 to FIG. 6, the insulating sealing plate 12 and the probe mounting plate 11 may be fixed with each other by providing a plurality of mounting openings on their peripheral sides for mounting fasteners.

In the present disclosure, the soft insulating sealing plate 12 may be provided on one side of the probe mounting structure 10. Since the insulating sealing plate 12 is soft and has one side in contact with the wafer under test 200, the wafer under test 200 may be prevented from being crushed and damaged. Further, the unevenness of the wafer under test 200 may be absorbed, ensuring the air pressure in each mounting hole 111.

Figure 7:
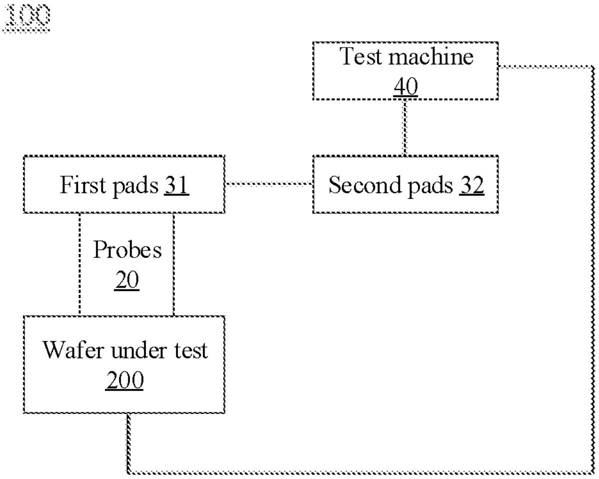
FIG. 7 illustrates a connection schematic diagram of an exemplary wafer-level reliability test system according to various disclosed embodiments of the present disclosure.
Figure 8:
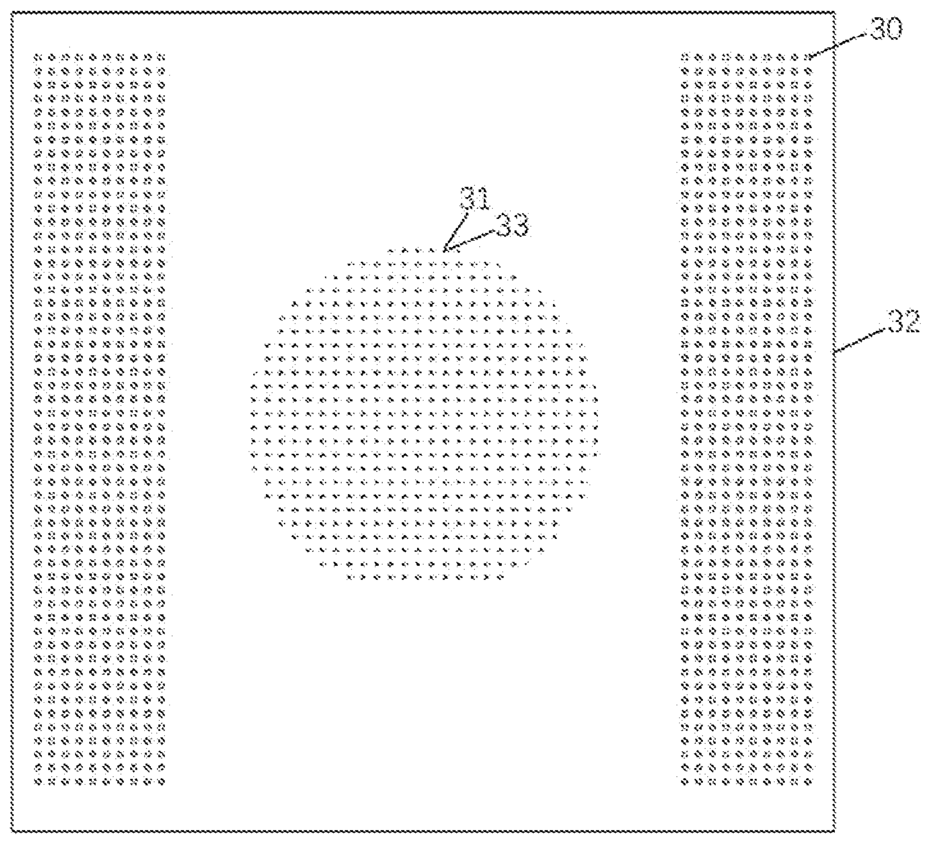
FIG. 8 illustrates a test circuit board of an exemplary wafer-level reliability test system according to various disclosed embodiments of the present disclosure.

The present disclosure also provides a wafer-level reliability test system. As shown in FIG. 7 illustrating a connection diagram of a wafer-level reliability test system and FIG. 8 illustrating a test circuit board 30 of a wafer-level reliability test system, in one embodiment, the wafer-level reliability test system 100 may include a test machine 40, a test circuit board 30, probes 20, and a probe mounting structure 10. The probe mounting structure 10 may be any probe mounting structure provided by various embodiments of the present disclosure. The test machine 40 may be used to provide high voltage power for testing. As shown in FIG. 8, the test circuit board 30 may include a plurality of second pads 32. Each second pad 32 may be connected to one corresponding first pad 31 through the circuit on the circuit board. Each second pad 32 may be also connected to the test machine 40 for receiving high-voltage power from the test machine 40. The wafer under test 200 may be also connected to the test machine 40 to form a test loop. The test machine 40 may be also used to determine the test result of the wafer under test 200 according to the current in the test loop.

In the probe mounting structure 10 for the wafer-level reliability test provided by the present disclosure, a plurality of probes 20 may be mounted at one time, to perform batch testing on all dies of the wafer under test 200. Since each probe 20 is disposed in one corresponding mounting hole 111 independently and each mounting hole 111 is filled with the high-pressure gas to maintain the pressure of each small chamber independently, it may be unnecessary to put the whole wafer and all of the plurality of probes 20 into one sealed chamber. The structure may be simpler, and it may be easier to maintain the pressure. Also, the safety may be higher. Therefore, the efficiency and safety of the wafer-level reliability test (high-voltage test) may be improved.

Figure 9:
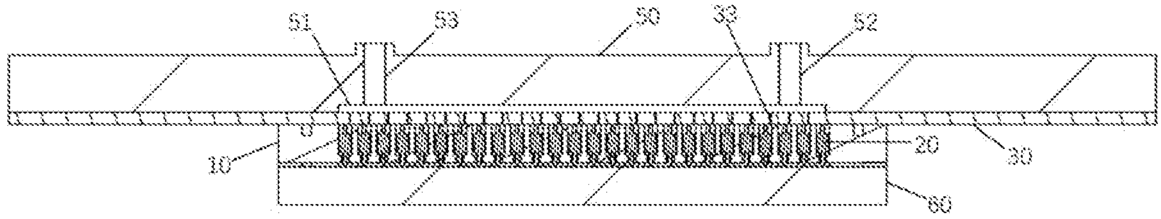
FIG. 9 illustrates a cross-sectional view of an exemplary wafer-level reliability test system according to various disclosed embodiments of the present disclosure.
Figure 10:
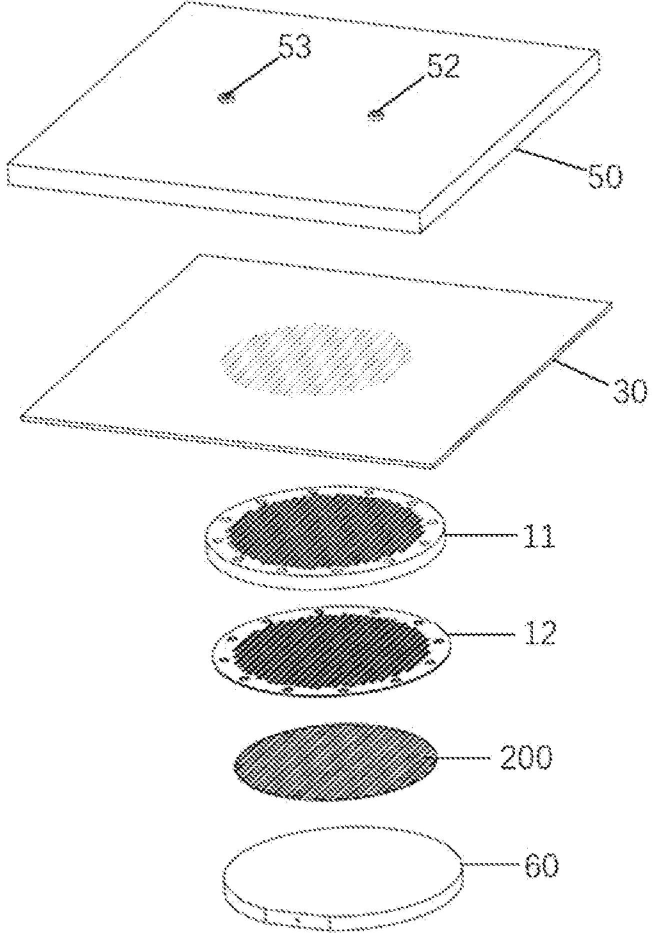
FIG. 10 illustrates an exploded view of an exemplary wafer-level reliability test system according to various disclosed embodiments of the present disclosure.

In another embodiment shown in FIG. 9 illustrating a cross-sectional view of a wafer-level reliability test system and FIG. 10 illustrating an exploded structure of a wafer-level reliability test system (the wafer under test 200 is shown in FIG. 10 while the probes 20 are not shown), the wafer-level reliability test system 100 may further include a cover plate 50. The cover plate 50 may be attached to a side of the test circuit board 30 away from the probe mounting plate 11. The cover plate 50 may be also provided with a recessed sunken platform 51 on one side of the cover plate 50 close to the circuit board, and the sunken platform 51 may be connected to all the ventilation holes 33. The cover plate 50 may be also provided with an air inlet hole 52 and an air outlet hole 53 connected with the sunken platform 51 for introducing or discharging high-pressure gas respectively.

In the present disclosure, through the arrangement of the sunken platform 51, the air inlet hole 52 and the air outlet hole 53 on the cover plate 50, the introduction and discharge of high-pressure gas to each mounting hole 111 may be realized. Through a simple structure, the high-pressure gas may be charged or discharged in batches to each mounting hole 111.

In one embodiment shown in FIG. 9 and FIG. 10, the wafer-level reliability test system 100 may further include a heating module and a heat sink 60. The heating module may be used to provide heat. The heat sink 60 may be disposed between a side of the wafer under test 200 away from the insulating sealing plate 12 and the heating module, and may be used to conduct heat from the heating module to the wafer under test 200. The heating module may be set on the test bench, and the heating module may be any commonly used module for generating heat, which is not limited here.

In this embodiment, the heating module and the heat sink 60 may provide heat for the wafer under test 200, so that the wafer is kept in a reasonable temperature range during high-voltage testing.

In one embodiment, the heat sink 60 may be connected to the test machine 40 for forming a testing loop. That is, for the wafer-level reliability testing system 100 including the heat sink 60 and the heating module, the heat sink 60 may be included in the test loop. For example, the test machine 40, the second pads 32, the first pads 31, the probes 20, the wafer under test 200 and the heat sink 60 may be connected in sequence to form a test loop. In one embodiment, the high voltage of the test machine 40 may flow to the heat sink 60. In another embodiment, the high voltage of the test machine 40 may flow to the second pads 32, as long as a loop can be formed.

In one embodiment, the probes 20 may be spring probes.

In the present disclosure, the spring probes may be used for testing. Since a spring probe has a certain amount of expansion and contraction along its length direction, the spring probes may be compatible with different thicknesses of the wafer under test 200, and may be also be compatible with a certain degree of warpage of the wafer under test 200. Therefore, the spring probes may have a wider application range.

In the probe mounting structure for the wafer-level reliability test provided by the present disclosure, a plurality of probes may be mounted at one time, to perform batch testing on all dies of the wafer under test. Since each probe is disposed in one corresponding mounting hole independently and each mounting hole is filled with the high-pressure gas to maintain the pressure of each small chamber independently, it may be unnecessary to put the whole wafer and all of the plurality of probes into one sealed chamber. The structure may be simpler, and it may be easier to maintain the pressure. Also, the safety may be higher.

In the present disclosure, the soft insulating sealing plate may be provided on one side of the probe mounting structure. Since the insulating sealing plate is soft and has one side in contact with the wafer under test, the wafer under test may be prevented from being crushed and damaged. Further, the unevenness of the wafer under test may be absorbed, ensuring the air pressure in each mounting hole.

In the present disclosure, through the arrangement of the sunken platform, the air inlet hole and the air outlet hole on the cover plate, the introduction and discharge of high-pressure gas to each mounting hole may be realized. Through a simple structure, the high-pressure gas may be charged or discharged in batches to each mounting hole.

In the present disclosure, the heating module and the heat sink may provide heat for the wafer under test, such that the wafer is kept in a reasonable temperature range during high-voltage testing.

In the present disclosure, the spring probes may be used for testing. Since a spring probe has a certain amount of expansion and contraction along its length direction, the spring probes may be compatible with different thicknesses of the wafer under test and may also be compatible with a certain degree of warpage of the wafer under test. Therefore, the spring probes may have a wider application range.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A probe mounting structure for a wafer-level reliability test, comprising a probe mounting plate, wherein:

the probe mounting plate is provided with a plurality of mounting holes penetrating through a thickness direction of the probe mounting plate;

a volume of each mounting hole of the plurality of mounting holes is smaller than a preset value, the mounting hole is used to install a corresponding probe, and two opposite end portions of the corresponding probe are both arranged inside the mounting hole;

two opposite end portions of each probe are respectively connected to a corresponding first pad on a test circuit board and a corresponding die of a wafer under test;

two sides of the probe mounting plate are in proximity to the test circuit board and the wafer under test respectively, such that each of the plurality of mounting holes forms a sealed chamber; and the plurality of mounting holes is filled with high-pressure gas to ensure that the wafer under test does not spark during high-voltage testing.

2. The probe mounting structure according to claim 1, wherein:

the preset value is configured according to a shape or a volume of the probes.

3. The probe mounting structure according to claim 1, wherein:

a shape of the plurality of mounting holes matches a shape of the probes.

4. The probe mounting structure according to claim 1, wherein:

the high-pressure gas is filled into the plurality of mounting holes through gas inlets connected to the plurality of mounting holes.

5. The probe mounting structure according to claim 1, wherein:

a vent hole connected to each of the plurality of mounting holes is provided on the test circuit board.

6. The probe mounting structure according to claim 1, wherein:

the high-pressure gas is an arc-extinguishing gas.

7. A probe mounting structure for a wafer-level reliability test, comprising a probe mounting plate and a soft insulating sealing plate, wherein:

the probe mounting plate is provided with a plurality of mounting holes penetrating through a thickness direction of the probe mounting plate;

a volume of each mounting hole of the plurality of mounting holes is smaller than a preset value, and the mounting hole is used to install a corresponding probe;

two ends of each probe are respectively connected to a corresponding first pad on a test circuit board and a corresponding die of a wafer under test;

two sides of the probe mounting plate are in proximity to the test circuit board and the wafer under test respectively, such that each of the plurality of mounting holes forms a sealed chamber;

the plurality of mounting holes is filled with high-pressure gas to ensure that the wafer under test does not spark during high-voltage testing;

two sides of the soft insulating sealing plate are respectively attached to the wafer under test and a side of the probe mounting plate away from the test circuit board; and the insulating sealing plate is provided with a plurality of through holes, and the plurality of through holes has a one-to-one correspondence to the plurality of mounting holes, such that one end of one probe passes through a corresponding one of the plurality of through holes and is in contact with a corresponding die of the wafer under test.

8. The probe mounting structure according to claim 7, wherein:

the insulating sealing plate and the probe mounting plate are connected through adhesive or fasteners.

9. The probe mounting structure according to claim 7, wherein:

the insulating sealing plate is made of fluorine rubber.

10. The probe mounting structure according to claim 7, wherein:

a side of the insulating sealing plate facing the probe mounting plate is bonded to the probe mounting plate through adhesive, and the insulating sealing plate and the probe mounting plate are fixed with each other by providing a plurality of mounting openings on their peripheral sides for mounting fasteners.

11. A wafer-level reliability test system, comprising a test machine, a test circuit board, probes, and a probe mounting structure including a probe mounting plate, wherein:

the test machine is electrically connected to the test circuit board, the probe mounting structure is arranged adjacent to and below the test circuit board, and the probes are arranged in the probe mounting plate;

the probe mounting plate is provided with a plurality of mounting holes penetrating through a thickness direction of the probe mounting plate;

a volume of each mounting hole of the plurality of mounting holes is smaller than a preset value, the mounting hole is used to install one corresponding probe, and two opposite end portions of the corresponding probe are both arranged inside the mounting hole;

two opposite end portions of each probe are respectively connected to a corresponding first pad on the test circuit board and a corresponding die of a wafer under test;

two sides of the probe mounting plate are in proximity to the test circuit board and the wafer under test respectively, such that each of the plurality of mounting holes forms a sealed chamber;

the plurality of mounting holes is filled with high-pressure gas to ensure that the wafer under test does not spark during high-voltage testing;

the test machine is used to provide high-voltage power for testing;

the test circuit board also includes a plurality of second pads, wherein each of the plurality of second pads is connected to one corresponding first pad through circuits on the test circuit board, and each of the plurality of second pads is also connected to the test machine for receiving the high-voltage power from the test machine; and the wafer under test is also connected to the test machine to form a test loop and the test machine is also used to determine test results of the wafer under test based on current in the test loop.

12. The wafer-level reliability test system according to claim 11, wherein:

the test circuit board is also provided with a plurality of vent holes, wherein each of the plurality of vent holes is connected to a corresponding one of the plurality of mounting holes such that the high-pressure gas is able to be introduced into the plurality of mounting holes through the plurality of vent holes.

13. The wafer-level reliability test system according to claim 11, further including a cover plate, wherein:

the cover plate is attached to a side of the test circuit board away from the probe mounting plate;

the cover plate is provided with a sunken platform on a side of the cover plate close to the test circuit board;

the sunken platform is connected with all the plurality of vent holes; and the cover plate is also provided with an air inlet hole and an air outlet hole connected with the sunken platform, respectively used to charge or discharge of the high-pressure gas.

14. The wafer-level reliability test system according to claim 11, further including:

an insulating sealing plate between the probe mounting plate and the wafer under test;

a heating module for providing heat; and a heat sink disposed between the heating module and a side of the wafer under test away from the insulating sealing plate, wherein the heat sink is configured to conduct the heat of the heating module to the wafer under test.

15. The wafer-level reliability test system according to claim 11, wherein:

the probes are spring probes.

16. The wafer-level reliability test system according to claim 11, wherein:

the probe mounting structure further includes a soft insulating sealing plate two sides of the soft insulating sealing plate are respectively attached to the wafer under test and a side of the probe mounting plate away from the test circuit board; and the insulating sealing plate is provided with a plurality of through holes, and the plurality of through holes has a one-to-one correspondence to the plurality of mounting holes, such that one end of one probe passes through a corresponding one of the plurality of through holes and is in contact with a corresponding die of the wafer under test.

17. The wafer-level reliability test system according to claim 16, wherein:

the insulating sealing plate and the probe mounting plate are connected through adhesive or fasteners.

* * * * *